United States Patent
Li et al.

(10) Patent No.: US 12,418,993 B2
(45) Date of Patent: Sep. 16, 2025

(54) DISPLAY MODULE AND DISPLAY TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Dengqian Li, Wuhan (CN); Xindan Zhang, Wuhan (CN)

(*) Notice: Subject to any disclaimer, the term of this patent is extended or adjusted under 35 U.S.C. 154(b) by 0 days.

(21) Appl. No.: 17/635,575

(22) PCT Filed: Dec. 30, 2021

(86) PCT No.: PCT/CN2021/142882
§ 371 (c)(1),
(2) Date: Feb. 15, 2022

(87) PCT Pub. No.: WO2023/123159
PCT Pub. Date: Jul. 6, 2023

(65) Prior Publication Data
US 2024/0040714 A1      Feb. 1, 2024

(30) Foreign Application Priority Data
Dec. 28, 2021   (CN) .......................... 202111622822.X

(51) Int. Cl.
H05K 5/02       (2006.01)
H10K 59/80      (2023.01)
H10K 102/00     (2023.01)

(52) U.S. Cl.
CPC ............... *H05K 5/02* (2013.01); *H10K 59/80* (2023.02); *H10K 2102/311* (2023.02)

(58) Field of Classification Search
CPC .................. H10K 2102/311; H10K 59/80
See application file for complete search history.

(56) References Cited

U.S. PATENT DOCUMENTS

2016/0268542 A1   9/2016   Suzuki
2018/0090713 A1 * 3/2018   Lee ...................... H10K 59/131
(Continued)

FOREIGN PATENT DOCUMENTS

CN       111028677 A       4/2020
CN       212061687 U  *  12/2020  ............. G09F 9/301
(Continued)

OTHER PUBLICATIONS

3M; https://web.archive.org/web/20210517035355/https://www.3m.com/3M/en_US/p/d/b40071696/ (Year: 2021).*

*Primary Examiner* — Joshua Benitez Rosario
*Assistant Examiner* — Christopher A Culbert

(57) ABSTRACT

A display module and a display terminal are provided. The display module includes a display panel, a support layer, and a buffer layer, wherein the display panel includes a display portion, a terminal bonding portion, and a bent portion. The support layer is disposed between the display portion and the terminal bonding portion, the buffer layer is disposed on the support layer, the buffer layer includes a first portion and a second portion disposed on a side of the first portion, the second portion corresponds to the terminal bonding portion, and rigidity of the second portion is greater than rigidity of the first portion.

19 Claims, 3 Drawing Sheets

(56) References Cited

U.S. PATENT DOCUMENTS

2020/0050055 A1 2/2020 Higano et al.
2020/0255709 A1* 8/2020 Reit ........................ G02B 1/11

FOREIGN PATENT DOCUMENTS

| CN | 112863336 | A |   | 5/2021  |          |
|----|-----------|---|---|---------|----------|
| CN | 112991945 | A | * | 6/2021  | G09F 9/301 |
| CN | 113257122 | A |   | 8/2021  |          |
| CN | 113471258 | A |   | 10/2021 |          |
| CN | 113658511 | A |   | 11/2021 |          |
| CN | 113724603 | A |   | 11/2021 |          |
| CN | 113744630 | A |   | 12/2021 |          |
| CN | 113764356 | A |   | 12/2021 |          |
| WO | 2021209057 | A1 |  | 10/2021 |          |

* cited by examiner

DISPLAY MODULE AND DISPLAY TERMINAL

TECHNICAL FIELD

The present application relates to a field of display technology, in particular to a display module and a display terminal.

BACKGROUND

A width of a frame of a flexible display module of an OLED can be narrowed by pad bending, and a bending radius of a pad is one of factors affecting the width of the frame of the display module. The less the bending radius of the pad, the narrower the width of the frame of the display module.

Wherein it is critical for product stability of the display module to keep the bending radius of the pad without deformation or with a small amount of deformation. However, the pad of flexible display module is generally subjected to a large stress, and the bending radius of the pad is easily deformed during a pad bending process and a subsequent production process, resulting in poor product stability of the display module.

TECHNICAL PROBLEMS

A current flexible display module has a technical problem that the bending radius of the pad is easily deformed during a pad bending process and a subsequent production process, resulting in poor product stability of the display module.

SUMMARY

The present application provides a display module and a display terminal to improve a technical problem of a current flexible display module that the bending radius of the pad is easily deformed during a pad bending process and a subsequent production process, resulting in poor product stability of the display module.

To solve the above technical problem, the present application provides the following technical solutions:

The present application provides a display module comprising:
- a display panel comprising a display portion, a terminal bonding portion, and a bent portion disposed between the display portion and the terminal bonding portion, wherein the bent portion is bent away from a light emitting direction of the display panel;
- a support layer disposed between the display portion and the terminal bonding portion; and
- a buffer layer disposed on the support layer, wherein the buffer layer comprises a first portion, and a second portion disposed on a side of the first portion, and the second portion corresponds to the terminal bonding portion; and
- wherein rigidity of the second portion is greater than rigidity of the first portion.

In the display module of the present application, an orthographic projection of the terminal bonding portion on the buffer layer is defined in the second portion.

In the display module of the present application, an orthographic projection of a boundary between the terminal bonding portion and the bent portion on the buffer layer is defined in the second portion.

In the display module of the present application, the first portion is disposed separately from the second portion.

In the display module of the present application, a distance between the first portion and the second portion is greater than or equal to a thickness of the first portion or a thickness of the second portion in the light emitting direction of the display panel.

In the display module of the present application, the first portion and the second portion constitute an intermediate layer of the buffer layer.

In the display module of the present application, the buffer layer further comprises a first adhesive layer and a second adhesive layer disposed on two sides of the intermediate layer, respectively.

In the display module of the present application, a ratio of a thickness of the first adhesive layer and a thickness of the second adhesive layer to a thickness of the intermediate layer in the light emitting direction of the display panel is between ¼ and 2.

In the display module of the present application, an orthographic projection of the first adhesive layer and the second adhesive layer on the intermediate layer is defined in the intermediate layer.

In the display module of the present application, a distance between an edge of the first adhesive layer and an edge of the intermediate layer, and a distance between an edge of the second adhesive layer and the edge of the intermediate layer are both less than or equal to a distance between the first portion and the second portion.

In the display module of the present application, the display portion comprises a display area, and a non-display area disposed on both sides of the display area, and the bent portion is connected to the display portion in the non-display area.

In the display module of the present application, an orthographic projection of the second portion on the display portion extends into the display area.

In the display module of the present application, the support layer comprises a first support portion, a second support portion, and a hollow portion disposed between the first support portion and the second support portion.

In the display module of the present application, an orthographic projection of the second portion on the support layer is defined separated from the hollow portion.

In the display module of the present application, the display module comprises a reinforcing plate disposed on a side of the support layer close to the terminal bonding portion.

In the display module of the present application, an orthographic projection of the reinforcing plate on the support layer is defined in the second portion.

In the display module of the present application, the display module comprises a second backplane disposed between the reinforcing plate and the terminal bonding portion.

In the display module of the present application, the terminal bonding portion is fixed to the second backplane.

In the display module of the present application, an orthographic projection of a boundary between the terminal bonding portion and the bent portion on the second backplane is defined in the second backplane.

The present application also provides a display terminal comprising a terminal body and the display module, wherein the display module and the terminal body are integrated.

BENEFICIAL EFFECTS

In the present application, the buffer layer positioned on the support layer is provided to include a first portion and a second portion, the second portion corresponds to the terminal bonding portion, and the rigidity of the second portion is greater than the rigidity of the first portion. On the basis of the support layer, the second portion having greater rigidity can further enhance the structural strength of the laminated structure at the position where the terminal bonding portion is positioned so that the bending radius of the bent portion is kept undeformed or a small amount of deformation, and the product stability of the display module is improved.

BRIEF DESCRIPTION OF THE DRAWINGS

In order to more clearly illustrate the technical solutions in the embodiments of the present application, the accompanying drawings required for use in the description of the embodiments will be briefly described below. It will be apparent that the accompanying drawings in the following description are merely some embodiments of the present application, and other drawings may be obtained from these drawings without creative effort by those skilled in the art.

Figure 1:
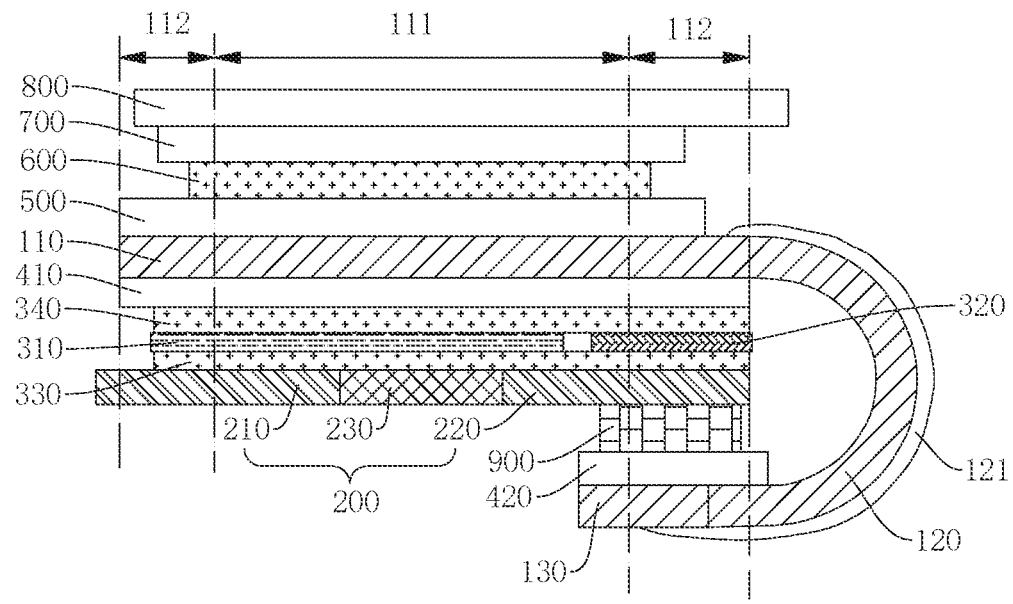
FIG. 1 is a schematic diagram of an overall structure of a display module according to the present application.

REFERENCE NUMERALS a display panel 100, a display portion 110, a display area 111, a non-display area 112, a bent portion 120, an ultraviolet curable glue 121, a terminal bonding portion 130, a support layer 200, a first support portion 210, a second support portion 220, a hollow portion 230, a buffer layer 300, a first portion 310, a second portion 320, a first adhesive layer 330, a second adhesive layer 340, a protective film layer 350, a release film 360, a temporary protective film 370, a first backplane 410, a second backplane 420, a polarizer 500, an optical adhesive layer 600, a flexible cover layer 700, a scratch resistant layer 800, and a reinforcing plate 900.

DETAILED DESCRIPTION OF THE EMBODIMENTS

The following describes the technical solutions of the embodiments of the present application in a clear and complete manner with reference to the accompanying drawings in the embodiments of the present application. It will be apparent that the described embodiments are only a part of the embodiments of the present application, but not all of the embodiments. Based on the embodiments of the present application, all other embodiments obtained by those skilled in the art without creative effort fall within the scope of the present application. Furthermore, it should be understood that the specific embodiments described herein are intended only to illustrate and explain the present application and are not intended to limit the present application. The terms "up" and "down" are used in the present application in the absence of a reverse description, generally referring to the upper and lower parts of the device in actual use or operation, in particular in the drawing direction; and terms "in" and "out" are for the profile of the device.

A width of a frame of a flexible display module of an OLED can be narrowed by pad bending, and a bending radius of a pad is one of factors affecting the width of the frame of the display module. The less the bending radius of the pad, the narrower the width of the frame of the display module.

Wherein it is critical for product stability of the display module to keep the bending radius of the pad without deformation or with a small amount of deformation. However, the pad of flexible display module is generally subjected to a large stress, and the bending radius of the pad is easily deformed during a pad bending process and a subsequent production process, resulting in poor product stability of the display module.

Referring to FIGS. 1 to 6, a display module includes a display panel 100, a support layer 200, and a buffer layer 300. The display panel 100 includes a display portion 110, a terminal bonding portion 130, and a bent portion 120 between the display portion 110 and the terminal bonding portion 130. The bent portion 120 is bent away from a light emitting direction of the display panel 100. The support layer 200 is disposed between the display portion 110 and the terminal bonding portion 130. The buffer layer 300 is disposed on the support layer 200. The buffer layer 300 includes a first portion 310, and a second portion 320 on a side of the first portion 310. The second portion 320 corresponds to the terminal bonding portion 130. Wherein rigidity of the second portion 320 is greater than rigidity of the first portion 310.

In the present application, the buffer layer 300 positioned on the support layer 200 is provided to include a first portion 310 and a second portion 320, the second portion 320 corresponds to the terminal bonding portion 130, and the rigidity of the second portion 320 is greater than the rigidity of the first portion 310. On the basis of the support layer 200, the second portion 320 having greater rigidity can further enhance structural strength of a laminated structure at the position where the terminal bonding portion 130 is positioned, so that the bending radius of the bent portion 120 is kept undeformed or slightly deformed, and the product stability of the display module is improved.

The technical solutions of this application will now be described with reference to specific embodiments. It should be noted that the order of description of the following embodiments is not a limitation on the preferred order of the embodiments.

In an embodiment, the display portion 110, the bent portion 120, and the terminal bonding portion 130 are integrally formed. The display portion 110 is a main body portion of the display panel 100 for displaying. The bent portion 120 is positioned at an end of the display portion 110 and is bent away from the light emitting direction of the display panel 100. The bent portion 120 may be provided with an ultraviolet curable adhesive 121 on a side away from the display portion 110. The terminal bonding portion 130 is connected to an end of the bent portion 120 away from the display portion 110, and the terminal bonding portion 130 is disposed on a side of the display portion 110 away from the light emitting direction of the display portion 110 and parallel to the display portion 110.

In this embodiment, the terminal bonding portion may be connected to an electrical component such as a flexible circuit board, a drive chip (not shown), or the like.

In the present embodiment, the display panel 100 may be a flexible display panel 100, such as an OLED panel, a mini-LED panel, a micro-LED panel, or the like.

In an embodiment, the support layer 200 may be a rigid support material, such as a metal or alloy plate/sheet such as a stainless-steel plate/sheet.

In an embodiment, the first portion 310 may be made of a relatively soft cushioning material, such as a sponge, rubber, or other foamed material.

In an embodiment, the second portion 320 may be made of a sheet material having a relatively great rigidity, such as a metal sheet, an alloy sheet, a stainless-steel sheet, or the like.

Referring to FIG. 1, in the display module of the present application, the display module may further include a first backplane 410 disposed on the buffer layer 300, a polarizer 500 disposed on the display portion 110, an optical adhesive layer 600 disposed on the polarizer 500, a flexible cover layer 700 disposed on the optical adhesive layer 600, and a scratch resistant layer 800 disposed on the flexible cover layer 700.

In an embodiment, a display portion 110 of the display panel 100 is disposed on the first backplane 410, and an orthographic projection of the display portion 110 on the first backplane 410 is in the first backplane 410.

In an embodiment, the first backplane 410 may be made of a flexible organic material such as polyimide (PI), polyester (BOPET), cycloolefin polymer, liquid crystal polymer (LCP), polydimethylsiloxane (PDMS), or the like.

In an embodiment, the polarizer 500 may be composed of a polyvinyl alcohol material layer (PVA), a cellulose triacetate material layer (TAC), a pressure sensitive adhesive layer, a release film 360, and a protective film layer 350.

In an embodiment, the optical adhesive layer 600 may be made of materials such as silicone rubber, acrylic resin, unsaturated polyester, polyurethane, and epoxy resin.

In an embodiment, the flexible cover layer 700 may be an ultra-thin glass (UTG) cover, a transparent polyimide (PI) cover.

In an embodiment, the scratch resistant layer 800 may be made of an organic film layer material having good scratch resistance, such as polyethylene terephthalate (PET) material or the like.

Referring to FIG. 1, in the display module of the present application, an orthographic projection of the terminal bonding portion 130 on the buffer layer 300 is in the second portion 320, so that all of the buffer layer 300 corresponding to the terminal bonding portion 130 is made of a material having greater rigidity, thereby improving stiffness and strength of a position where the terminal bonding portion 130 connects with other film layer of the display module, so that the bent portion 120 connected to the terminal bonding portion 130 is not easily deformed, so that the bending radius of the bent portion 120 is kept without deformation or slightly deformed, thereby improving product stability.

Since the boundary between the terminal bonding portion 130 and the bent portion 120 is subjected to a greater bending stress, the terminal bonding portion 130 is easily peeled from or displaced from another film layers of the display module at this position, resulting in a change in the bending radius of the bent portion 120. Therefore, in the present embodiment, an orthographic projection of the boundary between the terminal bonding portion 130 and the bent portion 120 on the buffer layer 300 is in the second portion 320.

In an embodiment, the boundary between the terminal bonding portion 130 and the bent portion 120 is provided at a position opposite to the second portion 320, so that the second portion 320 can provide a good structural strengthen effect on the boundary position between the terminal bonding portion 130 and the bent portion 120, and improve structural strength of the terminal bonding portion 130 bonded to another film layers of the display module.

Figure 2:
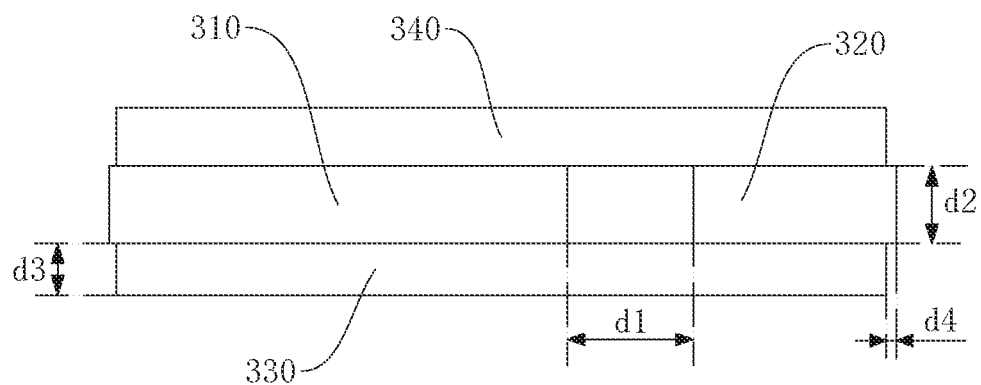
FIG. 2 is a schematic structural diagram of a buffer layer according to the present application.

Referring to FIG. 1 and FIG. 2, FIG. 2 is a schematic structural diagram of the buffer layer according to the present application. In the display module of the present application, the first portion 310 and the second portion 320 are separated from each other, so as to avoid or reduce mechanical interference due to different materials when the first portion 310 and the second portion 320 are directly connected, thereby ensuring normal display.

In an embodiment, a distance d1 between the first portion 310 and the second portion 320 is greater than or equal to a thickness d2 of the first portion 310 or the second portion 320 in the light emitting direction of the display panel 100. In an embodiment, the first portion 310 and the second portion 320 are provided so as to always maintain a sufficient distance with respect to the specifications of the display module, thereby better avoiding interference between the first portion 310 and the second portion 320 and ensuring display quality.

In an embodiment, according to the size of the display module, the distance d1 between the first portion 310 and the second portion 320 may be any value within 0.05 mm to 0.3 mm depending on the specification and size of the display module. In an embodiment, the distance d1 between the first portion 310 and the second portion 320 is not more than 0.3 mm, so that the distance d1 between the first portion 310 and the second portion 320 is not too large to form a film bonding step difference, and further, a problem of imprinting due to the step difference is avoided.

In an embodiment, in the light emitting direction of the display panel 100, the thickness of the first portion 310 may be equal to the thickness of the second portion 320, so that surfaces of the first portion 310 and the second portion 320 are flush, and the imprint caused by the step difference is further reduced. In an embodiment, the thickness d2 of the first portion 310 and the thickness d2 of the second portion 320 in the light emitting direction of the display panel 100 may be from 50 μm to 100 μm.

Referring to FIG. 2, in the display module of the present application, the first portion 310 and the second portion 320 constitute an intermediate layer of the buffer layer 300, and the buffer layer 300 further includes a first adhesive layer 330 and a second adhesive layer 340 disposed on a side of the intermediate layer, respectively. In an embodiment, the first adhesive layer 330 and the second adhesive layer 340 are disposed on either side of the intermediate layer formed by the first portion 310 and the second portion 320, so that the first adhesive layer 330 and the second adhesive layer 340 can fix and protect the first portion 310 and the second portion 320, and the first adhesive layer 330 and the second adhesive layer 340 can be bonded to other film layers of the display module.

In an embodiment, the first adhesive layer 330 and the second adhesive layer 340 may be made of a same material as the optical adhesive layer 600.

In an embodiment, referring to FIGS. 3 to 6, the buffer layer 300 may be separately stored by being covered with a protective film layer 350 on a surface before being combined with another film layers of the display module, that is, the protective film layer 350 may cover a side surface of the first adhesive layer 330 and the second adhesive layer 340 away from the intermediate layer. The protective film layer 350 on the surface is removed when used.

In an embodiment, the buffer layer 300 may be made by following steps:

S100: cutting the first adhesive layer 330 and the first portion 310 of the desired size according to the specification.

Figure 3:
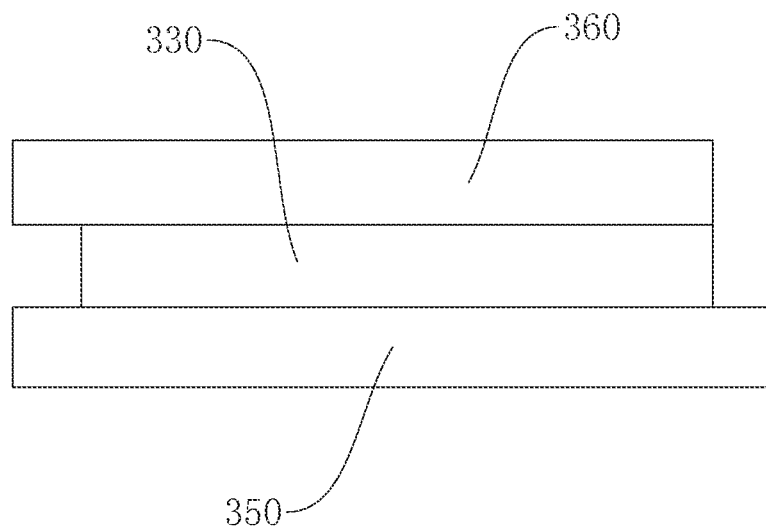
FIGS. 3 to 6 are schematic diagrams of a production process of a buffer layer according to the present application.

In an embodiment, referring to FIG. 3, the first adhesive layer 330 may be attached to the protective film layer 350, and the first adhesive layer 330 may be coated with the release film 360 on a surface of the first adhesive layer 330 away from the protective film layer 350 after cutting.

S200: bonding the first portion 310 to the side surface of the first adhesive layer 330.

Figure 4:
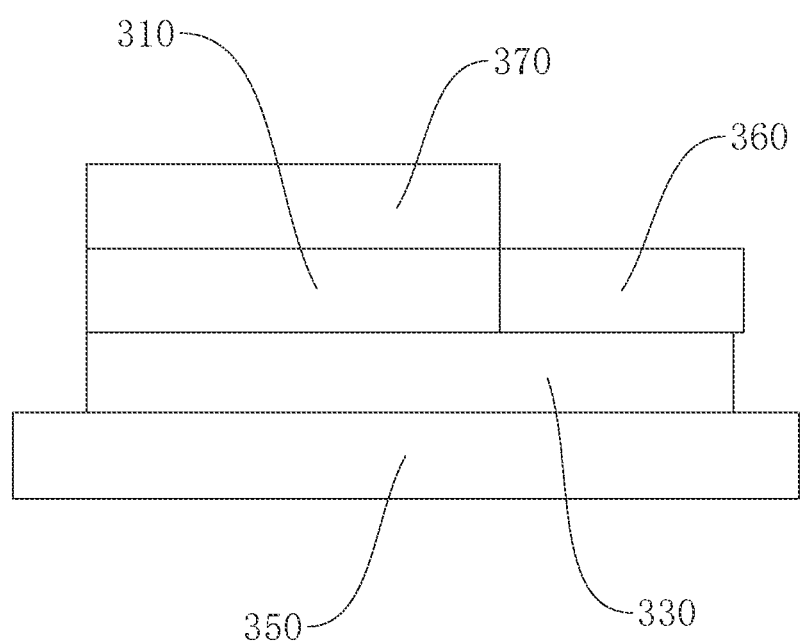

In an embodiment, referring to FIG. 4, a part of the release film 360 on the first adhesive layer 330 may be removed first, then the first portion 310 may be bonded at a position where the release film 360 is removed, and then the temporary protective film 370 may be coated on the surface of the first portion 310 again.

S300: cutting the second portion 320 of the desired size according to the specification.

S400: bonding the second portion 320 to the first adhesive layer 330, leaving a gap between the second portion 320 and the first portion 310.

Figure 5:
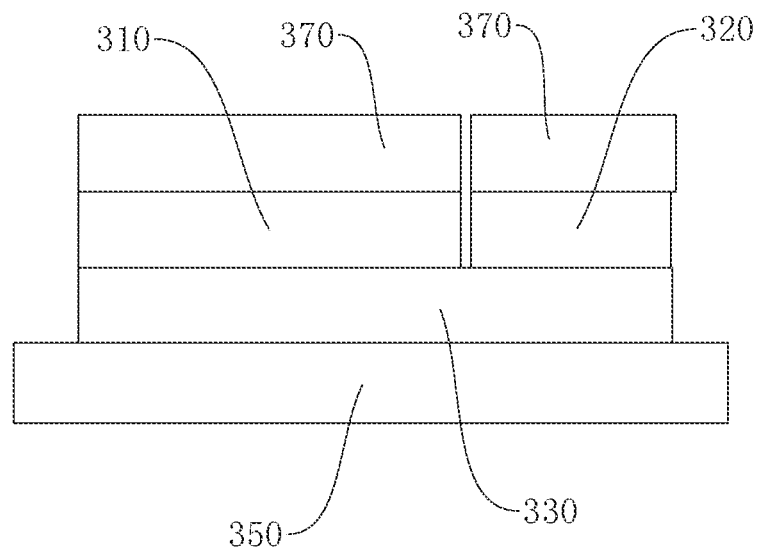

In an embodiment, referring to in FIG. 5, a remaining part of the release film 360 on the first adhesive layer 330 may be removed first, then the second portion 320 is bonded to the remaining portion of the release film 360, and then the temporary protective film 370 is coated on the surfaces of the first portion 310 and the second portion 320, respectively.

S500: cutting the second adhesive layer 340 of the desired size according to the specification.

S600: bonding the second adhesive layer 340 to the surfaces of the first portion 310 and the second portion 320 away from the first adhesive layer 330.

Figure 6:
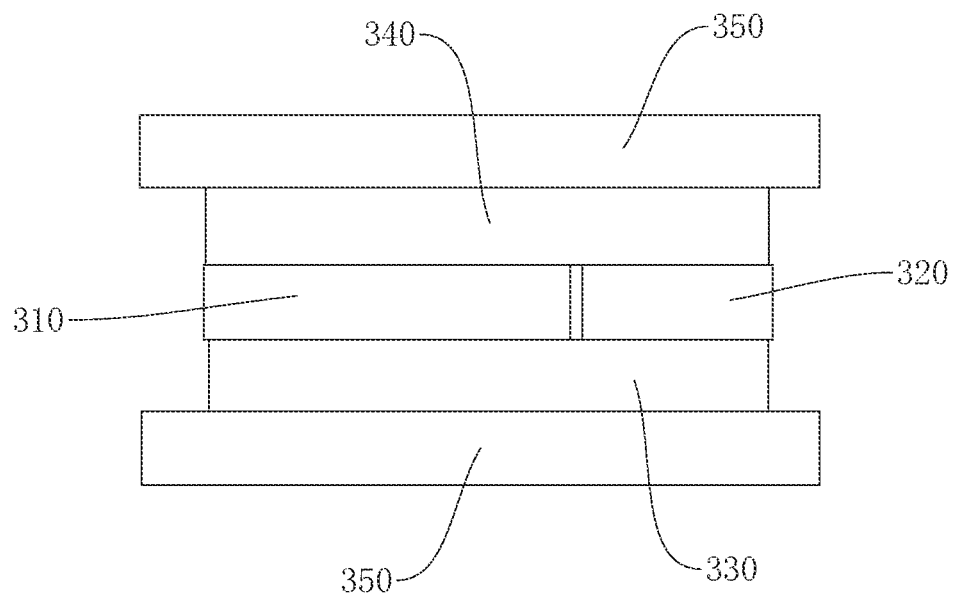

In an embodiment, referring to FIG. 6, the temporary protective film 370 on the surfaces of the first portion 310 and the second portion 320 is removed first, then the second adhesive layer 340 is bonded to the surface, and then another protective film layer 350 is bonded to the second adhesive layer 340.

Referring to FIG. 2, in an embodiment, a ratio of thicknesses d3 of the first adhesive layer 330 and the second adhesive layer 340 to a thickness of the intermediate layer (i.e., the thicknesses d2 of the first portion 310 and the second portion 320) in the light emitting direction of the display panel 100 is ¼ to 2. Specifically, as described above, in the light emitting direction of the display panel 100, the thicknesses d2 of the first portion 310 and the second portion 320 may be 50 μm to 100 μm, and the thickness d3 of the first adhesive layer 330 and the second adhesive layer 340 may be 25 μm to 100 μm.

In an embodiment, the thicknesses d3 of the first adhesive layer 330 and the second adhesive layer 340 are set to be 25 μm to 100 μm, so that the first adhesive layer 330 and the second adhesive layer 340 have good fixing and protection effects, and the laminated thickness of the display module can be prevented from being increased due to excessive thickness, thereby facilitating lightening of the display module.

Referring to FIG. 1, in the display module of the present application, an orthographic projection of the first adhesive layer 330 and the second adhesive layer 340 on the intermediate layer is in the intermediate layer to ensure that edges of the first adhesive layer 330 and the second adhesive layer 340 do not extend beyond the intermediate layer, thereby reducing a risk of glue overflow.

In an embodiment, a distance d4 between the edge of the first adhesive layer 330 and the edge of the intermediate layer, and between the edge of the second adhesive layer 340 and the edge of the intermediate layer is smaller than or equal to the distance d1 between the first portion 310 and the second portion 320. Specifically, as described above, the distance d1 between the first portion 310 and the second portion 320 may be 0.05 mm to 0.3 mm, and the distance d4 between the edge of the first adhesive layer 330 and the edge of the intermediate layer, and between the edge of the second adhesive layer 340 and the edge of the intermediate layer may be 0 to 0.02 mm.

In an embodiment, the distance d4 between the edge of the first adhesive layer 330 and the edge of the intermediate layer, and between the edge of the second adhesive layer 340 and the edge of the intermediate layer is set to be 0 to 0.02 mm, so that the risk of glue overflow can be effectively reduced, and the first adhesive layer 330 and the second adhesive layer 340 can sufficiently cover the first portion 310 and the second portion 320, thereby achieving better fixing and protection effects.

Referring to FIG. 1, in the display module of the present application, the display portion 110 includes a display area 111 and a non-display area 112 disposed on both sides of the display area 111, the bent portion 120 is connected to the display portion 110 in the non-display area 112, and an orthographic projection of the second portion 320 on the display portion 110 extends into the display area 111.

In an embodiment, the second portion 320 can extend below the display area 111 of the display portion 110, thereby increasing an area ratio of the second portion 320 in the intermediate layer, and further improving structure enhancement effect of the second portion 320 on the position of the terminal bonding portion 130.

Referring to FIG. 1, in the display module of the present application, the support layer 200 may include the first support portion 210, the second support portion 220, and the hollow portion 230 between the first support portion 210 and the second support portion 220. The hollow portion 230 corresponds to the display area 111 of the display portion 110. When the flexible display module is used to dynamically fold a display product, the flexible display module may be bent at the position of the hollow portion 230.

In an embodiment, an orthographic projection of the second portion 320 on the support layer 200 is provided separately from the hollow portion 230, that is, the second portion 320 may extend into the display area 111 of the display portion 110, but the second portion 320 cannot exceed a position corresponding to the hollow portion 230 so that the orthographic projection of the second portion 320 in the support layer 200 does not overlap the hollow portion 230. In the present embodiment, the second portion 320 having greater rigidity does not interfere with the bending of the display module in the hollow portion 230, thereby ensuring the dynamic bending performance of the display module.

Referring to FIG. 1, in a display module of the present application, the display module further includes a reinforcing plate 900 disposed on a side of the support layer 200 close to the terminal bonding portion 130, and an orthographic projection of the reinforcing plate 900 on the support layer 200 is in the second portion 320.

In an embodiment, the reinforcing plate 900 may be made of a polyimide (PI) material, a polyethylene terephthalate (PET) material, a copper-clad plate material, an aluminum sheet, a steel sheet, or the like.

In an embodiment, the reinforcing plate 900 is provided so that an orthographic projection of the reinforcing plate 900 on the support layer 200 is in the second portion 320, thereby enabling the second portion 320 to support and strengthen all positions of the reinforcing plate 900, thereby improving the reinforcing effect of the reinforcing plate 900.

Referring to FIG. 1, in the display module of the present application, the display module may further include a second backplane 420 disposed between the reinforcing plate 900 and the terminal bonding portion 130, and the terminal bonding portion 130 is fixed to the second backplane 420.

In an embodiment, the second backplane 420 may be made of a same material as the first backplane 410, i.e., the first backplane 410 and the second backplane 420 may be made of a flexible organic material such as polyimide (PI), polyester (BOPET), cycloolefin polymer, liquid crystal polymer (LCP), polydimethylsiloxane (PDMS), or the like, as described above.

In an embodiment, an orthographic projection of the boundary between the terminal bonding portion 130 and the bent portion 120 on the second backplane 420 is in the second backplane 420, so that the second backplane 420 can provide good support for the boundary position between the terminal bonding portion 130 and the bent portion 120, effectively alleviate the stress concentration problem at the boundary position, further improve bending radius stability of the bent portion 120, and further improve the product stability of the display module.

An embodiment of the present application further provides a display terminal comprising a terminal body and the display module, wherein the display module and the terminal body are integrated. In an embodiment, the display terminal may be an intelligent electronic display device such as a mobile phone, a computer, a television, or a wristwatch.

The display module and display terminal provided in the embodiments of the present application are described in detail above. The principles and embodiments of the present application are described in detail herein. The description of the embodiments is merely intended to help understand the method and core ideas of the present application. At the same time, a person skilled in the art may make changes in the specific embodiments and application scope according to the idea of the present application. In conclusion, the content of the specification should not be construed as a limitation to the present application.

What is claimed is:

1. A display module, comprising:
   a display panel comprising a display portion, a terminal bonding portion, and a bent portion disposed between the display portion and the terminal bonding portion, wherein the bent portion is bent away from a light emitting direction of the display panel;
   a support layer disposed between the display portion and the terminal bonding portion; and
   a buffer layer disposed on the support layer, wherein the buffer layer comprises a first portion and a second portion disposed on a side of the first portion, and the second portion is closer to the terminal bonding portion than the first portion;
   wherein rigidity of the second portion is greater than rigidity of the first portion; the first portion and the second portion are linearly spaced apart, and materials of the second portion and the support layer are rigid materials, and a material of the first portion is a soft cushioning material.

2. The display module according to claim 1, wherein an orthographic projection of the terminal bonding portion on the buffer layer is defined in the second portion.

3. The display module according to claim 2, wherein an orthographic projection of a boundary between the terminal bonding portion and the bent portion on the buffer layer is defined in the second portion.

4. The display module according to claim 1, wherein a distance between the first portion and the second portion is greater than or equal to a thickness of the first portion or a thickness of the second portion in the light emitting direction of the display panel.

5. The display module according to claim 1, wherein the first portion and the second portion constitute an intermediate layer of the buffer layer.

6. The display module according to claim 5, wherein the buffer layer further comprises a first adhesive layer and a second adhesive layer disposed on two sides of the intermediate layer, respectively.

7. The display module according to claim 6, wherein a ratio of a thickness of the first adhesive layer and a thickness of the second adhesive layer to a thickness of the intermediate layer in the light emitting direction of the display panel is between ¼ and 2.

8. The display module according to claim 6, wherein an orthographic projection of the first adhesive layer and the second adhesive layer on the intermediate layer is defined in the intermediate layer.

9. The display module according to claim 8, wherein a distance between an edge of the first adhesive layer and an edge of the intermediate layer, and a distance between an edge of the second adhesive layer and the edge of the intermediate layer are less than or equal to a distance between the first portion and the second portion.

10. The display module according to claim 3, wherein the display portion comprises a display area and a non-display area disposed on both sides of the display area, and the bent portion is connected to the display portion in the non-display area.

11. The display module according to claim 10, wherein an orthographic projection of the second portion on the display portion extends into the display area.

12. The display module according to claim 1, wherein the display module comprises a reinforcing plate disposed on a side of the support layer close to the terminal bonding portion.

13. The display module according to claim 12, wherein an orthographic projection of the reinforcing plate on the support layer is defined in the second portion.

14. The display module according to claim 13, wherein the display module comprises a second backplane disposed between the reinforcing plate and the terminal bonding portion.

15. The display module according to claim 14, wherein the terminal bonding portion is fixed to the second backplane.

16. The display module according to claim 15, wherein an orthographic projection of a boundary between the terminal bonding portion and the bent portion on the second backplane is defined in the second backplane.

17. A display terminal, comprising a display module, comprising:
   a display panel comprising a display portion, a terminal bonding portion, and a bent portion disposed between the display portion and the terminal bonding portion, wherein the bent portion is bent away from a light emitting direction of the display panel;
   a support layer disposed between the display portion and the terminal bonding portion; and
   a buffer layer disposed on the support layer, wherein the buffer layer comprises a first portion and a second portion disposed on a side of the first portion, and the second portion is closer to the terminal bonding portion than the first portion;

wherein rigidity of the second portion is greater than rigidity of the first portion; the first portion and the second portion are linearly spaced apart, and materials of the second portion and the support layer are rigid materials, and a material of the first portion is a soft cushioning material.

18. The display module according to claim 11, wherein the support layer comprises a first support portion, a second support portion, and a hollow portion disposed between the first support portion and the second support portion.

19. The display module according to claim 18, wherein an orthographic projection of the second portion on the support layer is defined separated from the hollow portion.

* * * * *